United States Patent
Liu

(10) Patent No.: US 8,762,098 B2
(45) Date of Patent: Jun. 24, 2014

(54) THERMAL TESTING SYSTEM AND METHOD

(75) Inventor: Fu-Ming Liu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 575 days.

(21) Appl. No.: 13/077,418

(22) Filed: Mar. 31, 2011

(65) Prior Publication Data

US 2012/0053859 A1    Mar. 1, 2012

(30) Foreign Application Priority Data

Aug. 31, 2010    (CN) .......................... 2010 1 0268011

(51) Int. Cl.
*G01K 13/00*    (2006.01)
(52) U.S. Cl.
USPC ............................................ 702/130; 374/57
(58) Field of Classification Search
USPC ................ 702/130, 132–136; 374/1, 57, 141
See application file for complete search history.

(56) References Cited

U.S. PATENT DOCUMENTS

| | | | | |
|---|---|---|---|---|
| 6,227,701 | B1 * | 5/2001 | Wu ................................. | 374/57 |
| 6,830,372 | B2 * | 12/2004 | Liu et al. ........................ | 374/57 |
| 7,690,839 | B2 * | 4/2010 | Ye et al. ......................... | 374/57 |
| 2006/0121421 | A1 * | 6/2006 | Spitaels et al. ............... | 434/118 |

* cited by examiner

*Primary Examiner* — Manuel L Barbee
(74) *Attorney, Agent, or Firm* — Novak Druce Connolly Bove + Quigg LLP

(57) ABSTRACT

A thermal testing system for an electronic device includes at least one airflow sensor, at least one temperature sensor, a data collecting module, and a computer. The at least one airflow sensor is configured to sense an airflow speed in the electronic device. The at least one temperature sensor is configured to sense temperature information of the electronic device. The data collecting module is connected to the at least one airflow sensor and the at least one temperature sensor, and configured to receive analog signals sensed by the at least one airflow sensor and the at least one temperature sensor and convert the analog signals to digital signals. The computer is connected to the data collecting module, and configured to receive the digital signals from the data collecting module and display a test result.

5 Claims, 4 Drawing Sheets

THERMAL TESTING SYSTEM AND METHOD

BACKGROUND

1. Technical Field

The present disclosure relates to testing systems and methods, especially to a thermal test system and method for an electronic device.

2. Description of Related Art

Computers need to be tested before they go to market. Some tests involve thermal testing for detecting whether the computers can maintain a temperature within a safe range. A typical thermal testing system includes a plurality of temperature sensors configured to collect temperature information of the computers and a plurality of airflow sensors configured to detect airflow speeds in the computers. Testers can determine whether the computers can pass the thermal testing according to the sensed information. However, the typical thermal testing system and method requires operators to read the sensed information and determine test results, which is inefficient and prone to human error.

Therefore, there is room for improvement within the art.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

In general, the word "module," as used herein, refers to logic embodied in hardware or firmware, or to a collection of software instructions, written in a programming language, such as, for example, Java, C, or assembly. One or more software instructions in the modules may be embedded in firmware, such as an EPROM. It will be appreciated that modules may comprise connected logic units, such as gates and flip-flops, and may comprise programmable units, such as programmable gate arrays or processors. The modules described herein may be implemented as either software and/or hardware modules and may be stored in any type of computer-readable medium or other computer storage device.

Figure 1:
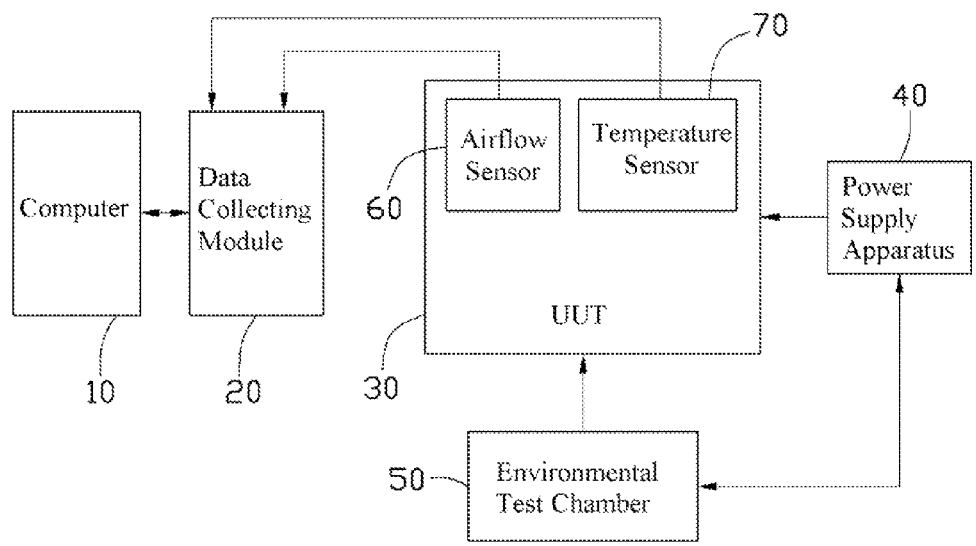
FIG. 1 is a block diagram of a thermal testing system according to an embodiment.

Referring to FIG. 1, a thermal testing system of an embodiment is configured to test a unit under test (UUT) 30. In one embodiment, the UUT 30 may be a computer mainframe, a motherboard, or other electronic device. The thermal testing system includes a computer 10, a data collecting module 20, a power supply apparatus 40, and an environmental test chamber 50. At least one airflow sensor 60 is placed in the UUT 30 for detecting an airflow speed in the UUT 30. At least one temperature sensor 70 is placed in the UUT 30 for detecting temperature information of the UUT 30. The environmental test chamber 50 provides various environmental conditions for the UUT 30. The power supply apparatus 40 supplies power to the environmental test chamber 50 and the UUT 30. The data collecting module 20 is connected to the airflow sensor 60 and the temperature sensor 70 for collecting signals sensed by the airflow sensor 60 and the temperature sensor 70. The data collecting module 20 converts the sensed signals and sends converted signals to the computer 10. The computer 10 displays a test result after analyzing the data.

Figure 2:
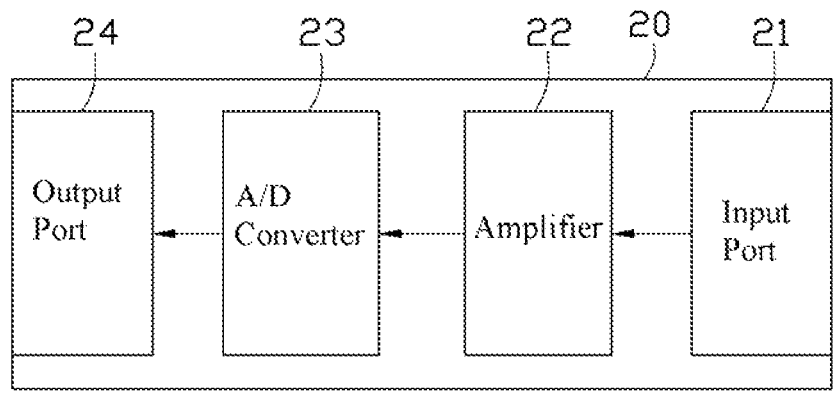
FIG. 2 is a detailed block diagram of a data collecting module of FIG. 1.

Referring to FIG. 2, the data collecting module 20 includes an input port 21, an amplifier 22 connected to the input port 21, an analog-to-digital (A/D) converter 23 connected to the amplifier 22, and an output port 24 connected to the A/D converter 23. The input port 21 is connected to the airflow sensor 60 and the temperature sensor 70 for receiving the sensed signals. The amplifier 22 amplifies the sensed signals received from the airflow sensor 60 and the temperature sensor 70. The signals sensed by the airflow sensor 60 and the temperature sensor 70 are analog signals. The A/D converter 23 converts the analog signals to digital signals. The digital signals are sent to the computer 10 via the output port 24. The output port 24 of the data collecting module 20 is connected to the computer 10 via a General Purpose Interface Bus (GPIB).

Figure 3:
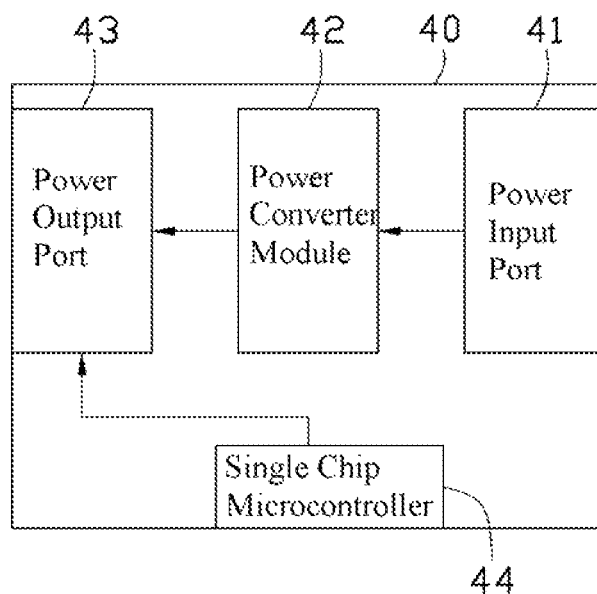
FIG. 3 is a detailed block diagram of a power supply apparatus of FIG. 1.

Referring to FIG. 3, the power supply apparatus 40 includes a power input port 41, a power converter module 42 connected to the power input port 41, a power output port 43 connected to the power converter module 42, and a single chip microcontroller 44 connected to the power output port 43. The power input port 41 is configured to receive an alterative current (AC) power source (e.g., AC 220V). The power converter module 42 converts the AC power source to working voltages for the environmental test chamber 50 and the UUT 30. The working voltages are supplied to the environment chamber 50 and the UUT 30 via the power output port 43.

Figure 4:
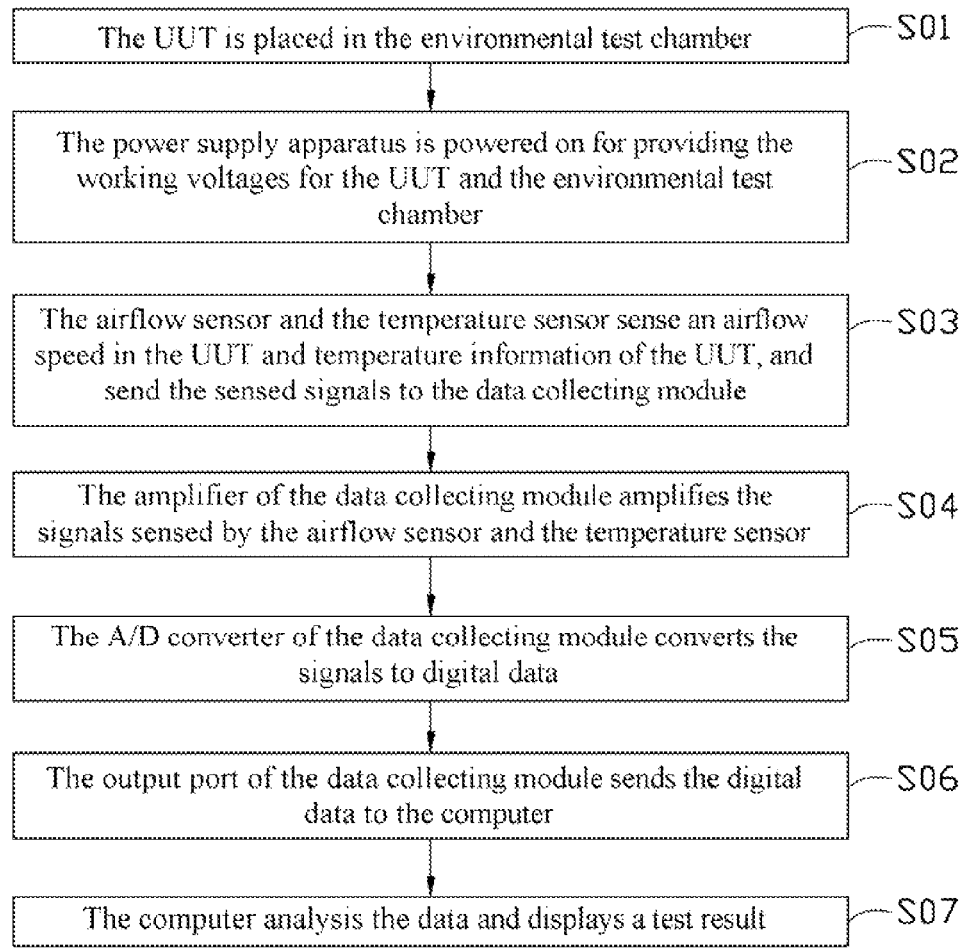
FIG. 4 is a flow chart of a thermal testing method according to an embodiment.

Referring to FIG. 4, a thermal testing method based upon the above thermal testing system includes the following blocks.

In block S01, the UUT 30 is placed in the environmental test chamber 50.

In a block S02, the power supply apparatus 40 is powered on for providing the working voltages for the UUT 30 and the environmental test chamber 50. In this block, the power supply apparatus 40 first supplies power only to the environmental test chamber 50. After the single chip microcontroller 44 detects that a predetermined environmental condition in the environmental test chamber 50 is reached, the single chip microcontroller 44 enables the power output port 43 to supply power to the UUT 30.

In block S03, the airflow sensor 60 and the temperature sensor 70 sense an airflow speed in the UUT 30 and temperature information of the UUT 30, and send the sensed signals to the data collecting module 20. In one embodiment, the airflow sensor 60 is placed near a cooling fan of the UUT 30, and the temperature sensor 70 is placed near a heat generating component (e.g., CPU) of the UUT 30.

In block SO4, the amplifier 22 of the data collecting module 20 amplifies the signals sensed by the airflow sensor 60 and the temperature sensor 70.

In block S05, the A/D converter 23 of the data collecting module 20 converts the signals to digital signals.

In block S06, the output port 24 of the data collecting module 20 sends the digital signals to the computer 10.

In block S07, the computer 10 analyzes the data received from the data collecting module 20 and displays a test result indicating whether the UUT 30 passes the thermal test.

While the present invention has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present invention will readily appear to those skilled in the art. Therefore, the present invention is not limited to the specific details and illustrative examples shown and described.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A thermal testing system for an electronic device comprising:
   at least one airflow sensor configured to sense an airflow speed in the electronic device;
   at least one temperature sensor configured to sense temperature information of the electronic device;
   a data collecting module, connected to the at least one airflow sensor and the at least one temperature sensor, configured to receive analog signals sensed by the at least one airflow sensor and the at least one temperature sensor and convert the analog signals to digital data;
   a computer, connected to the data collecting module, configured to receive the digital data from the data collecting module and display a test result;
   an environmental test chamber configured to accommodate the electronic device therein; and
   a power supply apparatus configured to supply power to the electronic device and the environmental test chamber; wherein the power supply apparatus comprises a power input port connected to an alternative current (AC) power source, a power converter configured to convert the AC power source to working voltages for the electronic device and the environmental test chamber, and a power output port configured to output the working voltages to the electronic device and the environmental test chamber, the power supply apparatus further comprises a single chip microcontroller configured to enable the power output port to output the working voltages when a predetermined environmental condition is satisfied.

2. The thermal testing system of claim 1, wherein the data collecting module includes an amplifier, configured to amplify the analog signals, and an analog-to-digital converter, configured to convert the analog signals to the digital data.

3. The thermal testing system of claim 1, wherein the data collecting module is connected to the computer via a General Purpose Interface Bus (GPIB).

4. A thermal testing method comprising:
   placing an airflow sensor and a temperature sensor in an electronic device;
   providing an environmental test chamber to accommodate the electronic device;
   providing a power supply apparatus to supply power to the electronic device and the environmental test chamber, wherein the power supply apparatus comprises a power input port connected to an alternative current (AC) power source, a power converter configured to convert the AC power source to working voltages for the electronic device and the environmental test chamber, and a power output port configured to output the working voltages to the electronic device and the environmental test chamber, the power supply apparatus further comprises a single chip microcontroller configured to enable the power output port to output the working voltages when a predetermined environmental condition is satisfied;
   sensing an airflow speed in the electronic device by the airflow sensor;
   detecting temperature information of the electronic device by the temperature sensor;
   converting signals sensed by the airflow sensor and the temperature sensor; and
   displaying a test result to indicate whether the electronic device can pass predetermined thermal tests.

5. The thermal testing method of claim 4, further comprising amplifying the signals sensed by the airflow sensor and the temperature sensor before converting the signals.

* * * * *